(12) United States Patent
Tateno

(10) Patent No.: US 6,242,766 B1
(45) Date of Patent: Jun. 5, 2001

(54) HIGH ELECTRON MOBILITY TRANSISTOR

(75) Inventor: Yasunori Tateno, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/443,210

(22) Filed: Nov. 18, 1999

(30) Foreign Application Priority Data

Mar. 19, 1999 (JP) .................................................. 11-076736

(51) Int. Cl.[7] .................................................. H01L 31/0328
(52) U.S. Cl. .............................. 257/194; 257/20; 257/24; 257/192; 257/194; 257/155
(58) Field of Search .................................. 257/194, 192, 257/20, 24, 195

(56) References Cited

U.S. PATENT DOCUMENTS

| | | | |
|---|---|---|---|
| 4,912,451 | * 3/1990 | Sugiyama et al. | 338/32 R |
| 4,980,731 | * 12/1990 | Hida | 357/22 |
| 5,486,705 | * 1/1996 | Inoue et al. | 257/24 |
| 5,811,843 | * 9/1998 | Yamamoto et al. | 257/194 |
| 5,900,653 | * 5/1999 | Suzuki et al. | 257/194 |
| 6,049,097 | * 4/2000 | Hida | 257/192 |
| 6,100,542 | * 8/2000 | Kohara et al. | 257/20 |

FOREIGN PATENT DOCUMENTS

| | | |
|---|---|---|
| 61-96768 | * 5/1986 | (JP) . |
| 61-96769 | * 5/1986 | (JP) . |
| 61-198784 | 9/1986 | (JP) . |
| 62-35678 | 2/1987 | (JP) . |
| 63-2384 | 1/1988 | (JP) . |

* cited by examiner

Primary Examiner—Tom Thomas
Assistant Examiner—Donghee Kang
(74) Attorney, Agent, or Firm—Armstrong, Westerman, Hattori, McLeland & Naughton, LLP

(57) ABSTRACT

A high electron mobility transistor including an n-type semiconductor layer having a mixed crystal of aluminum gallium arsenide with an aluminum mixed ratio set to fall in the range of 0.2~0.3, and an undoped semiconductor layer forming a superlattice structure of an electron supplying layer, the undoped semiconductor layer having a mixed crystal of aluminum gallium arsenide with an aluminum mixed ratio set to fall in the proximity of a critical mixed crystal ratio between direct transition and indirect transition.

4 Claims, 7 Drawing Sheets

HIGH ELECTRON MOBILITY TRANSISTOR

BACKGROUND OF THE INVENTION

1. Field of the Invention

The present invention generally relates to semiconductor devices, and in particular to a high electron mobility transistor that uses a mixed crystal of a compound semiconductor material.

2. Description of the Related Art

Recently as seen in a portable phone, satellite broadcasting and satellite communication, numerous communication systems using high-frequency waves such as microwaves or millimeter waves have been developed. In these systems, a high-power amplifier is indispensable for the final stage amplifier of the signal-transmitter unit thereof. Therefore, in view of the use of ultra high-frequency band in such systems, a high electron mobility transistor, also called HEMT, is widely used as the high-power output device. It should be noted that a HEMT is a transistor having superior high-frequency characteristics.

Hereinafter the structure and operation of a conventional HEMT used for high frequency and high power application will be described with reference to FIGS. 1–6.

FIG. 1 is a diagram showing the structure of a conventional HEMT. As shown in FIG. 1, a conventional HEMT includes an undoped GaAs layer 2 acting as a channel layer on a semi-insulating substrate 1 of GaAs. On the undoped GaAs layer 2, an undoped $Al_xGa_{1-x}As$ layer 4 is grown as a spacer layer, and an $n^+$-type $Al_xGa_{1-x}As$ layer 5 is grown on the undoped $Al_xGa_{1-x}As$ layer 4 as an electron supplying layer. On the $n^+$-type $Al_xGa_{1-x}As$ layer 5, there are provided an undoped $Al_xGa_{1-x}As$ layer 6, an undoped GaAs layer 7, and an $n^+$-type GaAs layer 8. Further, a two-dimensional electron gas 3 is formed in the undoped GaAs layer 2 along an interface to the undoped $Al_xGa_{1-x}As$ layer 4. The conventional HEMT also includes a gate electrode 9, a source electrode 10, and a drain electrode 11.

As seen above, the HEMT for high-power applications has the undoped layer 6 (which may also be an $n^-$-type layer) of $Al_xGa_{1-x}As$ for increasing the breakdown voltage of the HEMT. Further, a pair of undoped GaAs layers 7 are provided so as to laterally sandwich the gate electrode 9. In the structure of FIG. 1, the Al-content X of the layer 4 or 5, represented by the composition $Al_xGa_{1-x}As$, is desired to have a large value for improving the sheet density of the two-dimensional electron gas 3. however, when the parameter X is too large, the electron density of the two-dimensional electron gas 3 is easily saturated due to the fact that the donor impurity level becomes too deep. Further, the operation of the HEMT tends to become unstable as the HEMT begins to show an optical response. Therefore, the compositional parameter X of the $Al_xGa_{1-x}As$ in the layer 4 or layer 5 has been generally set to fall in the range of 0.2~0.3.

FIG. 2 is a diagram showing the band structure of the HEMT of FIG. 1 under a thermal equilibrium state. In FIG. 2, the relationship between the valence band Ev, the conduction band Ec, the Fermi level $E_F$, the ground state energy level Eo of electrons, and the first-excited energy level $E_1$, of the electrons, is represented.

FIG. 3 is a diagram showing the electron density distribution of the conventional HEMT of FIG. 1 under a thermal equilibrium state, wherein FIG. 3 shows the case in which the HEMT constitutes a normally-on device. FIG. 4 is a diagram showing the band structure of the HEMT under a biased state in which a gate bias voltage is applied in the three-terminal circuit model for causing the HEMT to turn on. Further, FIG. 5 is a diagram showing the electron density distribution of the HEMT in the aforementioned biased state.

Referring to FIG. 2 and FIG. 3, the electron supplying layer 5 is entirely depleted under the condition of thermal equilibrium. When a bias voltage is applied to the electrode 9, on the other hand, an electrically neutral region appears in the layer 5 and grows with an increase of the biased voltage. Thus, as shown in FIG. 5, the electron density of the $n^+$-type $Al_xGa_{1-x}As$ layer 5 increases with the gate voltage. It should be noted that the drift velocity of the electrons in the electron supplying layer 5 of $n^+$-type $Al_xGa_{1-x}As$ is lower than that in the channel layer 2 of undoped GaAs. Further, in view of the fact that the electrons in the layer 5 flow to the gate electrode 9 under such a state, the HEMT of FIG. 1 suffers from the problem of drastic decrease of the transconductance $g_m$, which tends to occur when the gate bias voltage is increased.

FIG. 6 is a diagram showing the relationship between the gate voltage $V_g$ and the transconductance $g_m$. In FIG. 6, the broken line 60 shows the characteristic of the conventional HEMT, while the solid line 61 shows the characteristic of the HEMT of the present invention to be described later.

Further, there is a HEMT having the electron supplying layer 5 formed of a superlattice structure of $n^+$-type GaAs and i-type AlAs. In this prior art HEMT, the aluminum atoms and the silicon atoms, the silicon atoms being doped as donors, are separated spatially from each other so as to minimize the interaction between the aluminum atoms and the silicon atoms. It should be noted that it is this interaction between Al and Si that makes the donor impurity level deep. Thereby the HEMT successfully avoids the problem of saturation of the electron density in the two-dimensional electron gas 3 and the problem of unstability of the HEMT operation caused by the optical response.

FIG. 7 is a diagram showing the band structure of the electron supplying layer having the superlattice structure consisting of $n^+$-type GaAs 13 and i-type AlAs 12, wherein the bend of the energy band is omitted. As shown in FIG. 7, the effective energy band gap Eg is defined as the difference between the energy level $E_{Qe}$ for the ground state of the electrons and the energy level $E_{Qh}$ for the ground state of the holes. It should be noted that the energy level of the electrons and holes is quantized as a result of formation of the superlattice structure. By choosing a proper thickness for the $n^+$-type GaAs layer 13, the energy gap Eg can be set equal to or greater than the gap energy for the case in which the compositional parameter X of the $n^+$-type $Al_xGa_{1-x}As$ layer 5 is set to about 0.3.

Therefore the electrons in the electron supplying layer having such a superlattice structure are not confined in the quantum well ($n^+$-type GaAs layer 13) of the superlattice under the thermal equilibrium state. In FIG. 7, it should be noted that the conduction band Ec of the i-type AlAs layer 12 is for the one at the Γ-valley.

However, even though the HEMT has such a structure, the electrons in the two-dimensional electron gas 3 are accelerated and flow easily into the electron supplying layer when a large drain current flows. As a result, the drastic decrease of the transconductance $g_m$ is still caused.

FIG. 8 is a diagram of the three-terminal characteristic of the high-power operation of the HEMT of FIG. 7 together with a load line 80. As shown in FIG. 8, the output power decreases due to the decrease of the transconductance $g_m$ in the high-current region 81. Further, it can be seen that the electric power gain, which depends on the mean value of the transconductance $g_m$, decreases also along the entire load line 80. Further, there is induced a decrease in the drain efficiency and power added efficiency as a result of the decrease of the transconductance $g_m$ at the proximity of a knee voltage. These drawbacks of conventional HEMT cause serious problems particularly when the HEMT is used for high-power applications.

SUMMARY OF THE INVENTION

It is a general object of the present invention to provide a novel and useful high electron mobility transistor wherein the foregoing problems are eliminated.

A more specific object of the present invention is to provide a high electron mobility transistor realizing an operation with high power, high gain and high efficiency.

The above object of the present invention is achieved by a high electron mobility transistor including an n-type semiconductor layer having a mixed crystal of aluminum gallium arsenide represented as, with the aluminum content x being set to fall in the range of 0.2~0.3, and an undoped semiconductor layer forming a superlattice structure of an electron supplying layer, the undoped semiconductor layer having a mixed crystal of aluminum gallium arsenide represented as $Al_yGa_{1-y}As$, with the aluminum content y being set to fall in the proximity of a critical composition in which an AlGaAs mixed crystal experiences a transition from direct transition type to an indirect transition type.

The above object of the present invention is also achieved by a high electron mobility transistor including a channel layer of a mixed crystal of indium gallium arsenide represented by $In_xGa_{1-x}As$ with the indium content x being set to fall in the range of 0.1~0.3, and an electron supplying layer provided above said channel layer, electron supplying layer having a superlattice structure and including an n-type semiconductor layer of a mixed crystal of aluminum gallium arsenide represented as $Al_yGa_{1-y}As$ with the aluminum content y being set equal to or smaller than 0.3, and an undoped semiconductor layer of a mixed crystal of aluminum gallium arsenide represented as $Al_xGa_{1-z}As$, with the aluminum content z being set to fall in the range of 0.4~0.5.

According to the present invention, the high electron mobility transistor can maintain the transconductance at a high value even when the high electron mobility transistor is operated under a condition in which a large drain current flows.

Other objects and further features of the present invention will become apparent from the following detailed description when read in conjunction with the attached drawings.

DESCRIPTION OF THE PREFERRED EMBODIMENT

Hereinafter, a preferred embodiment of the present invention will be described with reference to the drawings.

Figure 9:
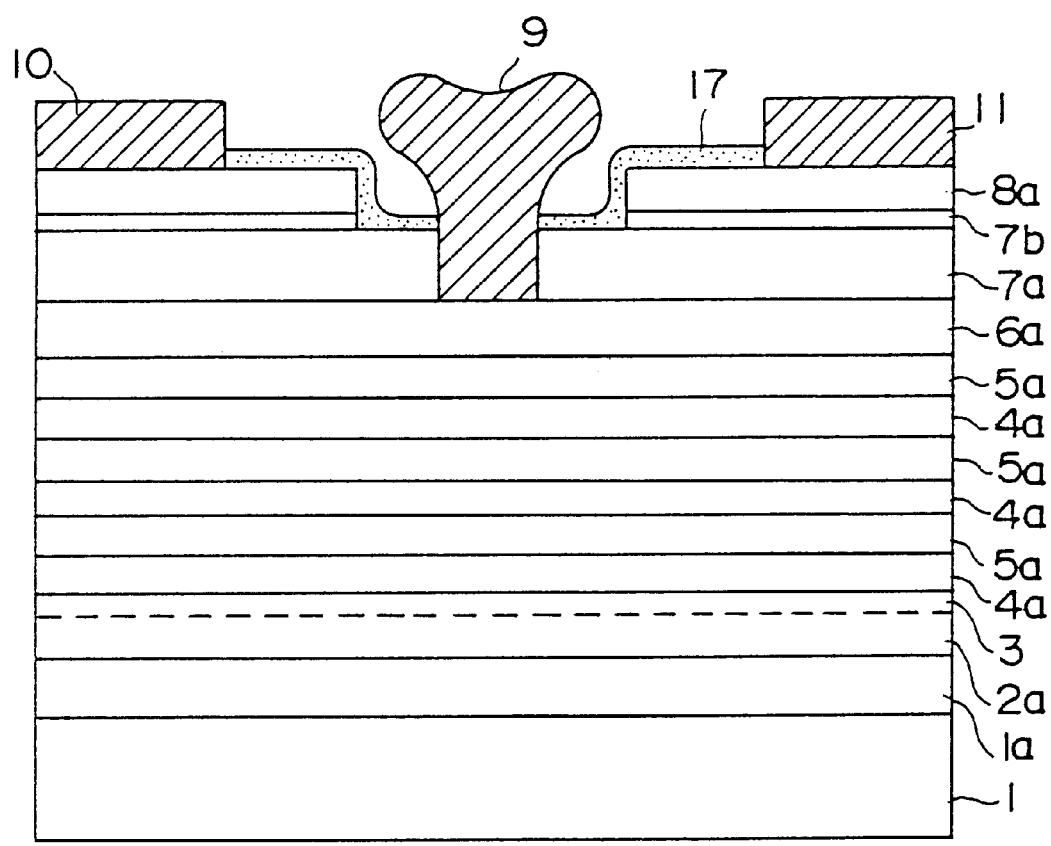
FIG. 9 is a diagram showing a structure of a HEMT for high-frequency and high-power operation according to an embodiment of the present invention.

FIG. 9 is a diagram showing a structure of a high-power HEMT according to a preferred embodiment of the present invention. The structure of the HEMT shown in FIG. 9 is generally identical to the structure of the conventional HEMT shown in FIG. 1. Thus, those parts corresponding to the parts described previously are designated by the same reference numerals and the description thereof will be omitted. Referring to FIG. 9, the difference exists in the materials forming the layers of the HEMT. In particular, the channel layer is formed by $In_{0.2}Ga_{0.8}As$ which provides a higher mobility and a higher drift velocity for the electrons.

More specifically, the HEMT of FIG. 9 includes a buffer layer 1a of i-type GaAs formed on a semi-insulating substrate 1 of GaAs with a thickness of 5000 Å. On the buffer layer 1a, there is provided a channel layer 2a of undoped $In_{0.2}Ga_{0.8}As$ with a thickness of 130 Å, and an undoped spacer layer 4a of $Al_{0.5}Ga_{0.5}As$ is provided on the channel layer 2a with a thickness of 40 Å. Further, an electron supplying layer 5a of $n^+$-type $Al_{0.2}Ga_{0.8}As$, doped to a carrier concentration level of $2\times10^{18}$ cm$^{-3}$, is provided on the spacer layer 4a with a thickness of 40 Å. In such a heteroepitaxial structure, a two-dimensional electron gas 3 is formed in the channel layer 2a along the interface to the spacer layer 4a. The layers 4a and 5a are repeated alternately to form a superlattice structure. On the electron supplying layer 5a, there is formed a barrier layer 6a of $Al_{0.2}Ga_{0.8}As$, doped to a carrier concentration level of $2\times10^{16}$ cm$^{-3}$, with a thickness of 200 Å, and a cap layer 7a of GaAs is formed on the barrier layer 6a with a thickness of 300 Å. The cap layer 7a is doped to a carrier concentration level of $2\times10^{16}$ cm$^{-3}$.

Further, an etching-stopper layer 7b of $n^+$-type $Al_{0.2}Ga_{0.8}As$, doped to a carrier concentration level of $2\times10^{18}$ cm$^{-3}$, is formed on the cap layer 7a with a thickness of 20 Å, and an ohmic contact layer 8a of GaAs, doped to a carrier concentration level of $2\times10^{18}$ cm$^{-3}$, is formed on the etching-stopper layer 7b with a thickness of 800 Å. On the cap layer 7a and the contact layer 8a, there is provided a passivation film 17 of SiN as shown in FIG. 9. Moreover the gate electrode 9 is provided in Schottky contact with the barrier layer 6a via an opening formed in the cap layer 7a so as to expose the barrier layer 6a, and the source electrode 10 and the drain electrode 11 are provided in ohmic contact with the contact layer 8a.

The gate electrode 9 has a T-type structure including therein a stacking of a WSi layer and a Au layer, and may have a gate length of 0.25 μm. The source electrode 10 and the drain electrode 11 are formed by AuGe/Ni/Au, and are separated from each other by a distance of about 4 μm.

According to the evaluations of the power characteristic conducted on the above HEMT of FIG. 9, it was confirmed that the gain is improved by about 1 dB over a conventional HEMT at the frequency of 20 GHz. Further under the same condition, it was indicated that the output power is improved by about 0.5 dB, and the power added efficiency is improved also by about 5%.

Figure 1:
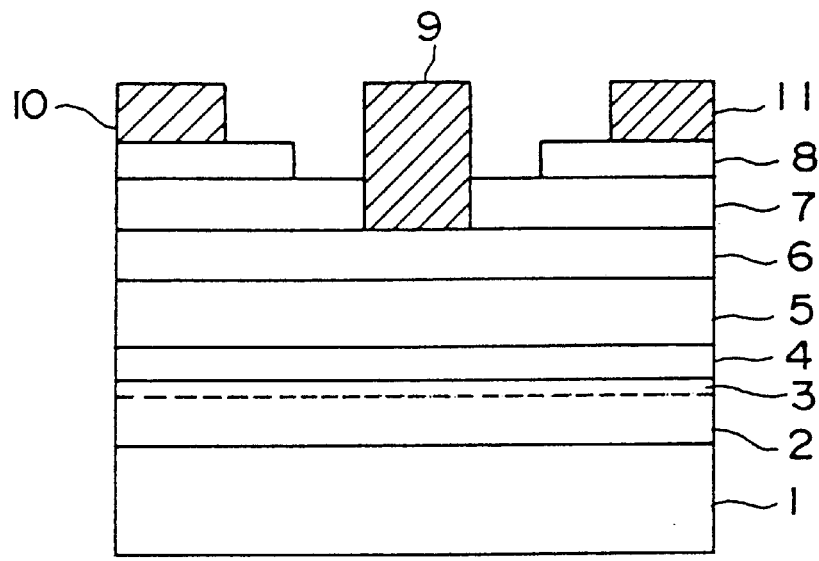
FIG. 1 is a diagram showing a structure of a conventional HEMT.
Figure 2:
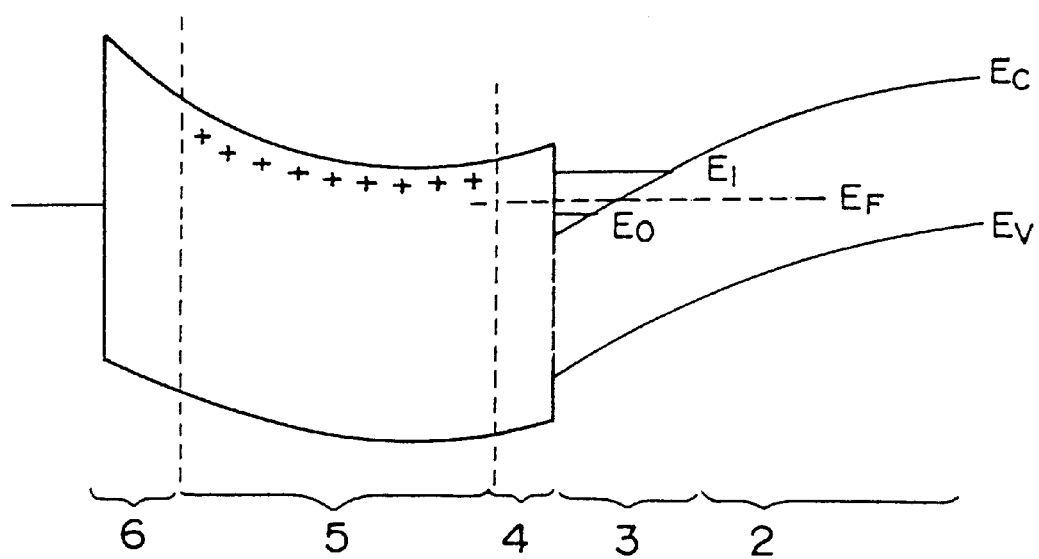
FIG. 2 is a diagram showing a band structure of the conventional HEMT of FIG. 1 under a thermal equilibrium state.
Figure 3:
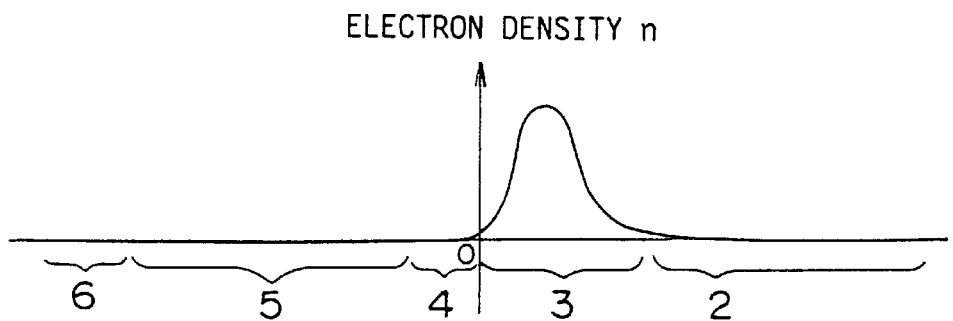
FIG. 3 is a diagram showing an electron density distribution of the conventional HEMT of FIG. 1 forming a normally-on device, under a thermal equilibrium state.
Figure 4:
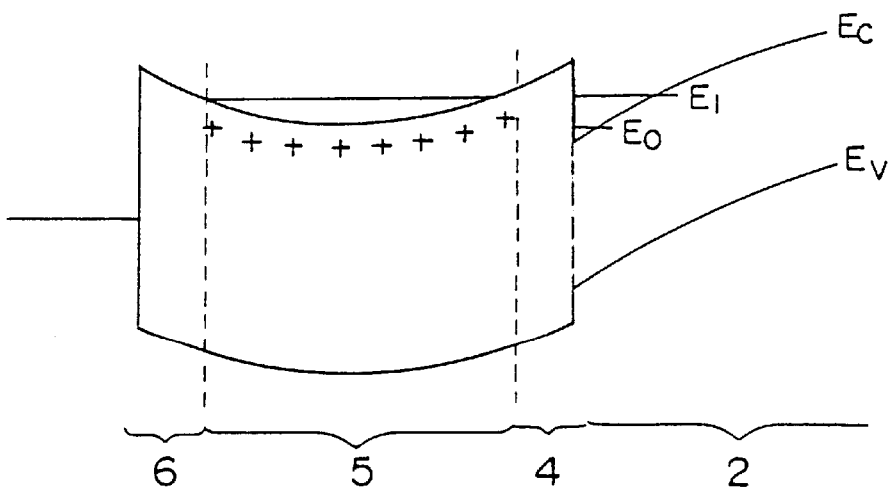
FIG. 4 is a diagram showing a band structure of the HEMT of FIG. 1 forming a three-terminal operation in a turn-on state.

In the present invention, the channel layer 2a may be formed of i-type GaAs in place of InGaAs, in the same way as in the device of FIG. 1.

Hereinafter the characteristic of the HEMT of FIG. 9 will be explained.

Figure 10:
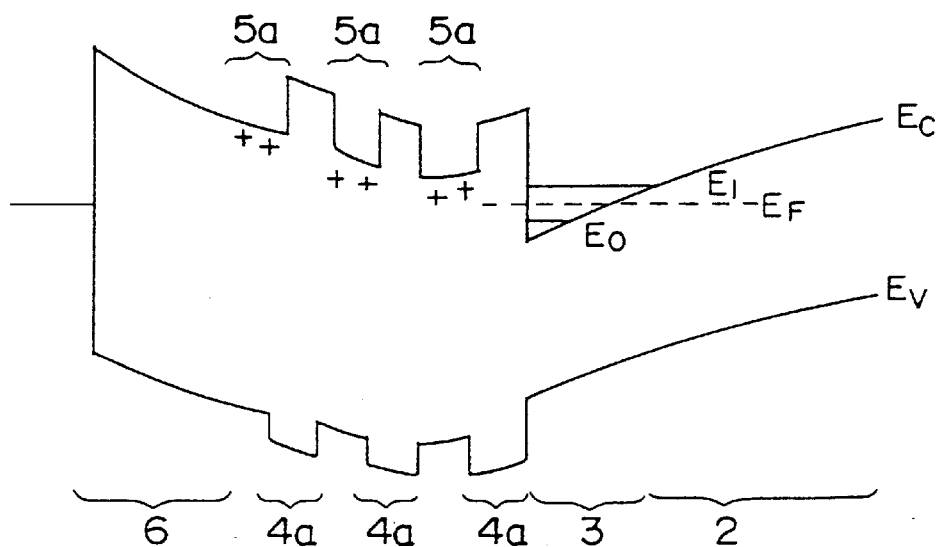
FIG. 10 is a diagram showing a band structure of the HEMT of FIG. 9 under a thermal equilibrium state.
Figure 11:
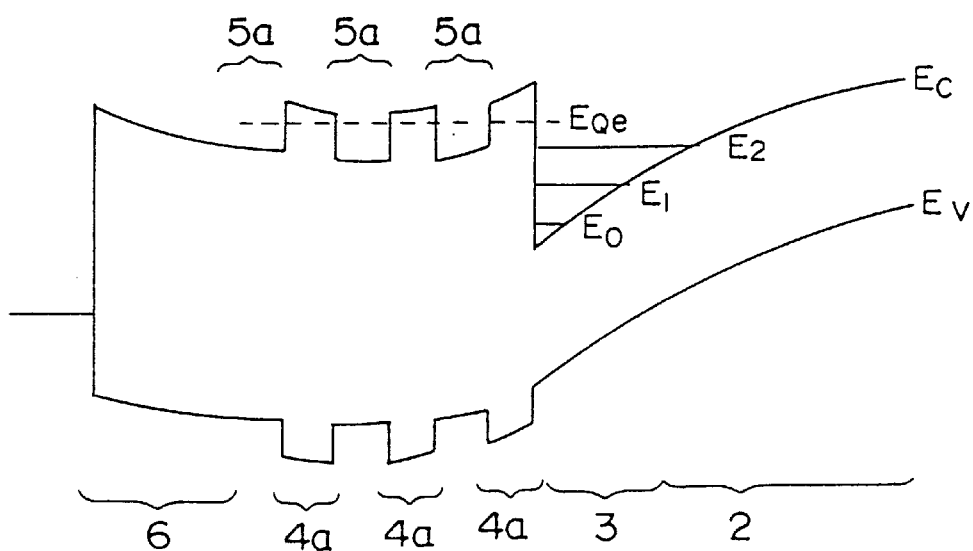
FIG. 11 is a diagram showing a band structure of the HEMT of FIG. 9 under the condition of large drain current.

FIG. 10 is a diagram showing the band structure of the HEMT of FIG. 9 under a thermal equilibrium state. On the other hand, FIG. 11 is a diagram showing the band structure of the same HEMT under a biased state for causing to flow a large drain current. In FIG. 11, the ground energy level $E_{Qe}$ of the electrons in the electron supplying layer 5a is illustrated. It should be noted that the energy level of the electrons is quantized in the electron supplying layer 5a as a result of the superlattice formation.

In this embodiment, as a result of the quantization, the energy level $E_{Qe}$ can be higher than the energy level of the electrons in the two-dimensional electron gas 3 even when the HEMT is biased to flow a large drain current.

Figure 5:
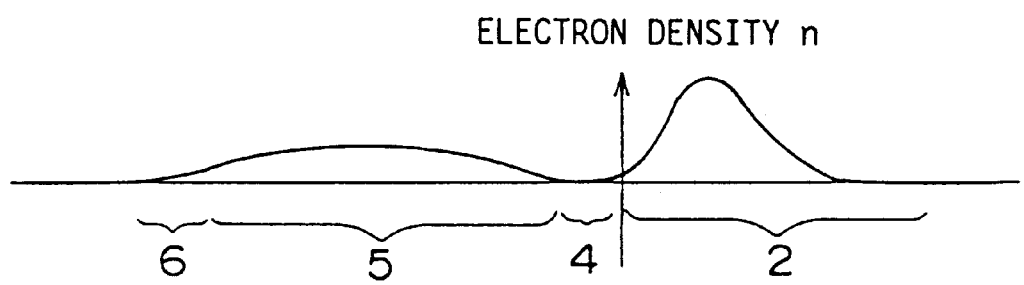
FIG. 5 is a diagram showing an electron density distribution of the HEMT in a forward-bias state.
Figure 6:
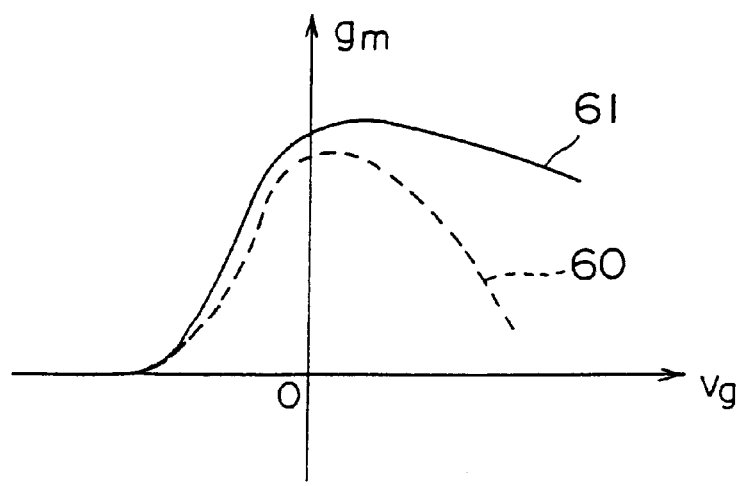
FIG. 6 is a diagram showing the dependence of transconductance on a gate voltage in the HEMT of FIG. 1.
Figure 7:
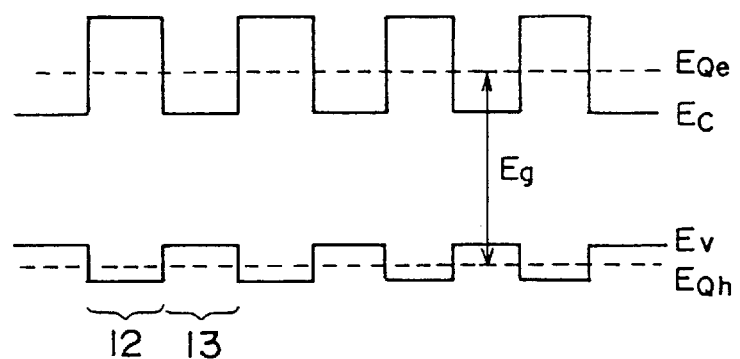
FIG. 7 is a diagram showing a band structure of an electron supplying layer of another conventional HEMT having a superlattice structure consisting of $n^+$-type GaAs and i-type AlAs layers for the electron supplying layer.
Figure 8:
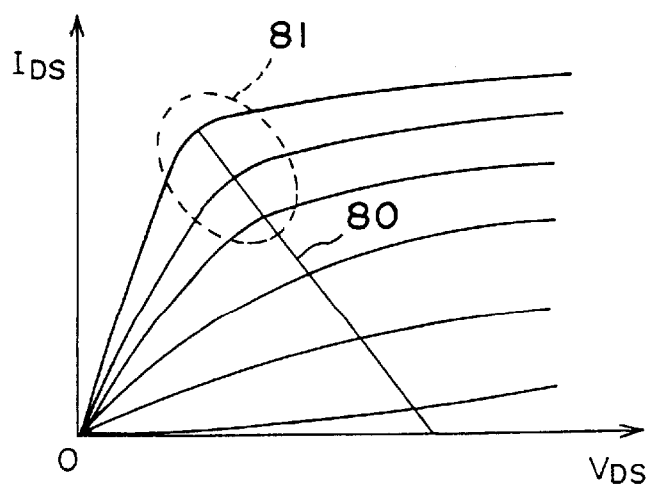
FIG. 8 is a diagram showing a three-terminal operation of a conventional high-power HEMT together with a load line.
Figure 12:
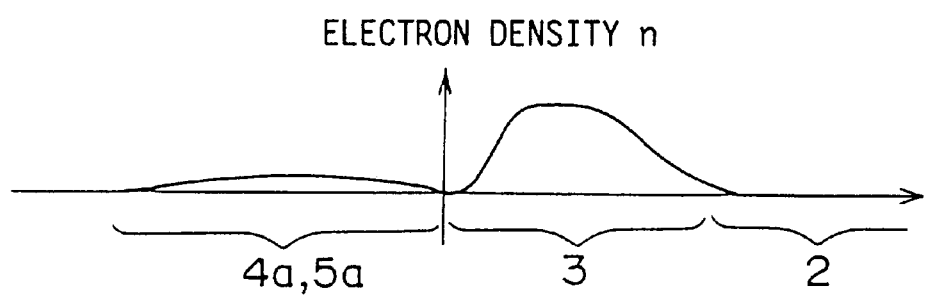
FIG. 12 is a diagram showing an electron density distribution of the HEMT of FIG. 9 under the condition of large drain current.

FIG. 12 is a diagram showing the electron density distribution of the above HEMT under the foregoing in biased condition. As shown in FIG. 12, the probability of the electrons existing in the electron supplying layer 5a is reduced substantially from the conventional diagram of FIG. 5. Thereby as illustrated by the solid line 61 in FIG. 6, the transconductance is maintained at a high level value even though the HEMT is biased to flow a large drain current, wherein FIG. 6 reflects the situation in which the electron density of the two-dimensional electron gas is increased substantially as compared with the conventional HEMT.

Figure 13:
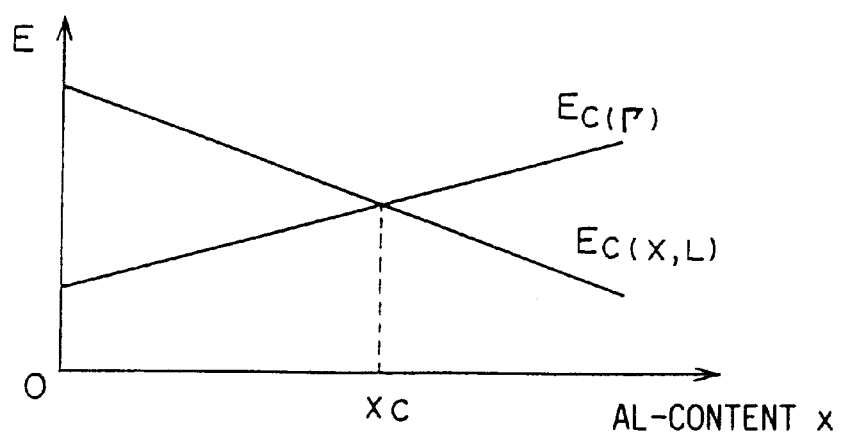
FIG. 13 is a diagram showing the relationship between the conduction band and composition of an $Al_xGa_{1-x}As$ mixed crystal.

FIG. 13 is a diagram showing the conduction band energy of a $Al_xGa_{1-x}As$ mixed crystal as a function of the Al-content x.

Generally, in the band structure of a semiconductor crystal, there are several different minima in the conduction band called γ-valley, X-valley and L-valley with respective, different crystal momenta.

As shown in FIG. 13, the energy level $Ec(\Gamma)$ at the γ-valley of the conduction band becomes higher as the value of Al-content X gets larger. On the contrary, the energy level at the X-valley or L-valley($Ec(X,L)$)of the conduction band becomes lower. Therefore the energy levels at the X-valley and the γ-valley are lower than the energy level at the γ-valley in the case the Al-content X is equal to or larger than a critical composition Xc, where Xc takes a value of about 0.5. It should be noted that the AlGaAs layer is a direct transition type in the case that the Al-content X is smaller than the critical value Xc and becomes an indirect transition type when the Al-content X exceeds the critical value Xc.

In the electron supplying layer forming the superlattice structure, it is desired that the layer 4a has as high an energy level for the conduction band Ec as possible for increased barrier height. For this, it is desired that the layer 4a has the Al-content x as large as possible. However in the case that the Al-content X of the $Al_xGa_{1-x}As$ layer 4a exceeds the critical ratio Xc, the conduction band energy level $Ec(X, L)$ for any of the X-valley and the L-valley becomes lower than the conduction band energy level $Ec(\Gamma)$ for the Γ-valley, and the effective barrier height of the AlGaAs layer 4a becomes low. Therefore, about 0.5 is the most preferable value for the Al-content X of the $Al_xGa_{1-x}As$ layer 4a.

On the other hand, the $n^+$-type $Al_xGa_{1-x}As$, which is to be a material with a narrower band gap, is also desired to have as high an energy level of the conduction band Ec as possible for confirming electrons in the two-dimensional electron gas 3 effectively. However, too large of the Al-content X causes a problem that the impurity level formed therein becomes deep. It should be noted that Si is doped in the layer 5a as a donor. Accordingly, about 0.2 is the most preferable value for the Al-content X of the $n^+$-type $Al_xGa_{1-x}As$ layer 5a.

In addition, the above semiconductor material is not limited to the series of GaAs and AlGaAs or the superlattice structure consisting of $n^+$-type $Al_{0.2}Ga_{0.8}As$ and i-type $Al_{0.5}Ga_{0.5}As$ as disclosed heretofore.

The present invention is not limited to the specifically disclosed embodiment, and variations and modifications may be made without departing from the scope of the present invention.

The present application is based on Japanese priority application No.11-76736 filed on Mar. 19, 1999, the entire contents of which are hereby incorporated by reference.

What is claimed is:

1. A high electron mobility transistor comprising:
   a substrate;
   a channel layer formed on said substrate;
   an electron-supplying layer formed on said substrate; and
   a two-dimensional electron gas formed in said channel layer;
   said electron-supplying layer having a superlattice structure and comprising an alternating repetition of:
      an n-type semiconductor layer of a mixed crystal of aluminum gallium arsenide having a composition represented as $Al_xGa_{1-x}As$, with an aluminum content x set to fall in the range between 0.2 and about 0.3; and
      an undoped semiconductor layer of a mixed crystal of aluminum gallium arsenide having a composition represented as $Al_yGa_{1-y}As$, with an aluminum content y set to fall in the vicinity of a critical Al-content at which a transition occurs in an AlGaAs mixed crystal from a direct transition type to an indirect transition type.

2. The high electron mobility transistor as claimed in claim 1, wherein undoped semiconductor layer has a conduction band energy level for the Γ-valley lower than the energy level for any of the X-valley and the L-valley.

3. The high electron mobility transistor as claimed in claim 2, wherein said aluminum content y of said undoped semiconductor layer has a value between about 0.4 and about 0.5.

4. A high electron mobility transistor comprising:
   a substrate;
   a channel layer formed of a mixed crystal of InGaAs having a composition represented as $In_zGa_{1-z}As$, with an In-content z set in the range between about 0.1 and about 0.3, being formed on said substrate;
   an electron-supplying layer formed on said substrate; and
   a two-dimensional electron gas formed in said channel layer;
   said electron-supplying layer having a superlattice structure comprising an alternating repetition of:
      an n-type semiconductor layer of a mixed crystal of aluminum gallium arsenide having a composition represented as $Al_xGa_{1-x}As$, with an aluminum mixed content x set smaller than about 0.3; and
      an undoped semiconductor spacer layer of a mixed crystal of aluminum gallium arsenide having a composition represented as $Al_yGa_{1-y}As$, with an aluminum content y set to fall in the range between about 0.4 and about 0.5.

* * * * *